United States Patent
Calame et al.

(10) Patent No.: US 11,803,121 B2
(45) Date of Patent: Oct. 31, 2023

(54) METHOD FOR MANUFACTURING A HOROLOGY COMPONENT

(71) Applicant: ROLEX SA, Geneva (CH)

(72) Inventors: Florian Calame, Epalinges (CH); Alexandra Maegli, Geneva (CH); Xavier Multone, Lausanne (CH)

(73) Assignee: ROLEX SA, Geneva (CH)

( * ) Notice: Subject to any disclaimer, the term of this patent is extended or adjusted under 35 U.S.C. 154(b) by 607 days.

(21) Appl. No.: 16/718,578

(22) Filed: Dec. 18, 2019

(65) Prior Publication Data
US 2020/0201173 A1 Jun. 25, 2020

(30) Foreign Application Priority Data
Dec. 21, 2018 (EP) .................................... 18215108

(51) Int. Cl.
*G03F 7/40* (2006.01)
*G03F 7/00* (2006.01)

(52) U.S. Cl.
CPC .......... *G03F 7/0017* (2013.01); *G03F 7/0035* (2013.01); *G03F 7/0037* (2013.01); *G03F 7/405* (2013.01)

(58) Field of Classification Search
CPC .... G03F 7/0015; G03F 7/0035; G03F 7/0017; G03F 7/0037
See application file for complete search history.

(56) References Cited

U.S. PATENT DOCUMENTS

| | | | |
|---|---|---|---|
| 9,302,430 B2 | 4/2016 | Thiel et al. |
| 10,088,748 B2 | 10/2018 | Calame |
| 2003/0057096 A1 | 3/2003 | Morales et al. |
| 2010/0005659 A1 | 1/2010 | Dinger et al. |
| 2011/0020754 A1 | 1/2011 | Fiaccabrino |
| 2016/0178807 A1 | 6/2016 | Sagardoyburu |
| 2016/0179000 A1 | 6/2016 | Calame |
| 2018/0363159 A1 | 12/2018 | Audren et al. |

(Continued)

FOREIGN PATENT DOCUMENTS

| | | |
|---|---|---|
| CN | 101625542 A | 1/2010 |
| CN | 101918617 A | 12/2010 |
| EP | 2405300 A1 | 1/2012 |

(Continued)

OTHER PUBLICATIONS

European Search Report and Written Opinion dated Oct. 25, 2019 issued in counterpart application No. EP18215108; w/ English machine translation (total 31 pages).

(Continued)

*Primary Examiner* — Daborah Chacko-Davis
(74) *Attorney, Agent, or Firm* — Seckel IP, PLLC

(57) ABSTRACT

Method for manufacturing a master pattern for a mold for a horology component, wherein the method includes manufacturing a first structure from a first photosensitive resin comprising at least one layer of photosensitive resin comprising a first pattern obtained by polymerizing the first photosensitive resin by irradiation through at least one mask, then developing the first photosensitive resin; and transforming the first structure into a second structure by structuring at least one surface of the first structure by the addition of a second photosensitive resin to the at least one surface.

20 Claims, 8 Drawing Sheets

(56) References Cited

U.S. PATENT DOCUMENTS

2019/0032233 A1    1/2019  Wang et al.
2020/0201172 A1*   6/2020  Calame ................. G03F 7/2053

FOREIGN PATENT DOCUMENTS

| EP | 2672319 A1 | 12/2013 |
| EP | 3035125 A1 | 6/2016 |
| EP | 3037897 A1 | 6/2016 |
| EP | 3260932 A1 | 12/2017 |
| FR | 2757961 A1 | 7/1998 |
| WO | 2017102661 A1 | 6/2017 |
| WO | 2017148394 A1 | 9/2017 |

OTHER PUBLICATIONS

Eschenbaum et al., "Hybrid lithography: Combining UV-exposure and two photon direct laser writing", Optics Express, vol. 21, No. 24, 2013, pp. 29921-29926 (in English; cited in the ESR).
European Office Action dated Jan. 26, 2022 in counterpan application No. EP18215100 of co-pending U.S. Appl. No. 16/718,573; w/ English machine translation (total 8 pages).
European Search Report and Written Opinion dated Jun. 13, 2019 issued in application No. EP18215100, counterpart of co-pending U.S. Appl. No. 16/718,573; w/ English machine translation (total 14 pages).
Chinese Office Action and Search Report dated Jun. 10, 2022 in application No. CN201911338363.5, counterpart of co-pending U.S. Appl. No. 16/718,573; w/ English machine translation (total 13 pages).

* cited by examiner

METHOD FOR MANUFACTURING A HOROLOGY COMPONENT

This application claims priority of European patent application No. EP18215108.4 filed Dec. 21, 2018, the content of which is hereby incorporated by reference herein in its entirety.

The present invention relates to a method for manufacturing a master pattern intended to allow the manufacture of a mold for a horology component, and to a method for manufacturing a horology component. In other words, the present invention relates to a method for manufacturing a master pattern for a mold for a horology component and to a method for manufacturing a horology component.

Photolithography is a technique commonly employed in the manufacture of horology components, in particular making it possible to form a resin mold used for the manufacture of the horology components.

Patent EP2405300 describes, for example, the implementation of a method for manufacturing an at least two-level metallic piece part using the photolithography technique.

Document EP3035125 proposes an improved method for manufacturing a multilevel horology component, using the photolithography technique.

Document EP3260932 describes a method for manufacturing a horology component made of polycrystalline ceramic, in which method a mold formed by photolithography is used.

These approaches of the prior art which are based on so-called traditional photolithography nevertheless have the disadvantage of not making it possible to produce absolutely any three-dimensional shape, such as shapes that are complex on a micrometric or even nanometric scale.

Furthermore, the term "soft lithography" is used to describe a method that makes it possible to obtain a mold made of a soft material from a master pattern manufactured for example using a traditional photolithography method.

Such a method of the prior art nevertheless has the disadvantage of not making it possible to produce absolutely any three-dimensional shape, such as shapes that are complex on a micrometric or even nanometric scale.

Thus, one object of the present invention is to improve the methods known from the prior art and to propose a solution for the manufacture of a three-dimensional horology component, possibly of a shape that is complex on a micrometric or even nanometric scale. Another object of the invention is to allow the manufacture of a horology component with a high level of reliability, a high level of repeatability, and high precision.

To this end, the invention relates to a method for manufacturing a master pattern intended to allow the manufacture of a mold for a horology component, and to a method for manufacturing a horology component.

The method for manufacturing a master pattern for a mold for a horology component comprises at least the following steps:
  Manufacturing a first structure from a first photosensitive resin comprising at least one layer of photosensitive resin comprising a first pattern obtained by polymerizing the first photosensitive resin by irradiation through at least one mask, then developing said first photosensitive resin;
  Transforming the first structure into a second structure by structuring at least one surface of the first structure by the addition of a second photosensitive resin to said at least one surface. This step advantageously employs the two-photon polymerization technique.

The invention is more particularly defined by the claims.

These objects, features and advantages of the present invention will be set out in detail in the following description of particular embodiments, given by way of nonlimiting example with reference to the attached figures among which:

The invention notably implements a method for manufacturing a master pattern intended to allow the manufacture of a mold for a horology component, which advantageously combines at least one step based on traditional photolithography with at least one step based on the two-photon polymerization technique, known by its abbreviation TPP. This method is, for example, used in the method described in document U.S. Pat. No. 9,302,430, in a field distant from horology. Ultimately it can be likened to a particular, three-dimensional, form of photolithography very different from traditional photolithography.

More particularly, the invention implements a method of manufacture comprising at least a first step consisting in manufacturing E1 a first structure on a substrate, using the traditional photolithography technique, and a second step advantageously consisting in transforming E2 the first structure into a second structure, by a structuring of at least one surface of the first structure using the two-photon polymerization technique.

In a first embodiment of the invention, the method of manufacture comprises, in addition to the first and second steps E1 and E2:
  A third step consisting in manufacturing E3, E3' a master pattern 2 intended to allow the manufacture of a mold 3 for a horology component 6;
  A fourth step consisting in manufacturing E4 said mold 3;
  And a step consisting in manufacturing E5 said horology component 6.

Figure 1:
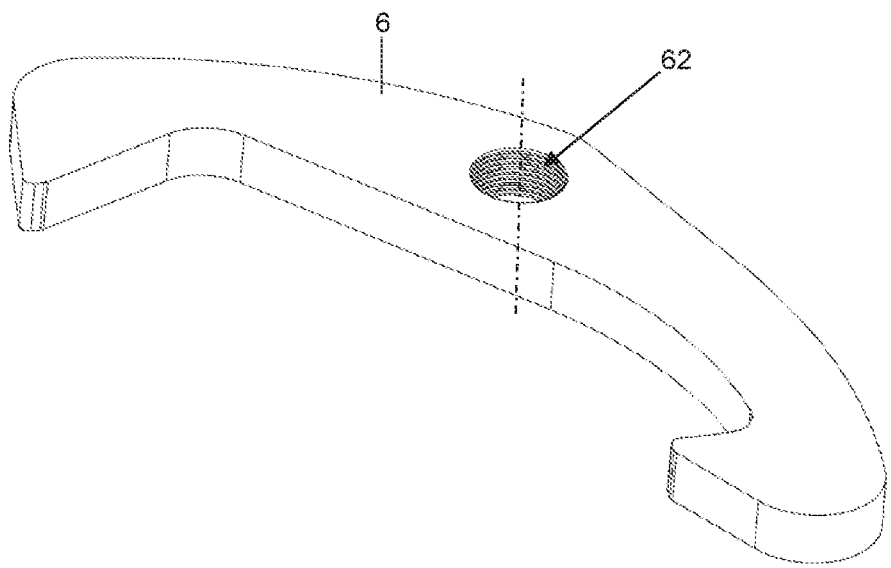
FIG. 1 depicts a perspective view of an automaton pawl produced by a method of manufacture according to one embodiment of the invention.
Figure 2:
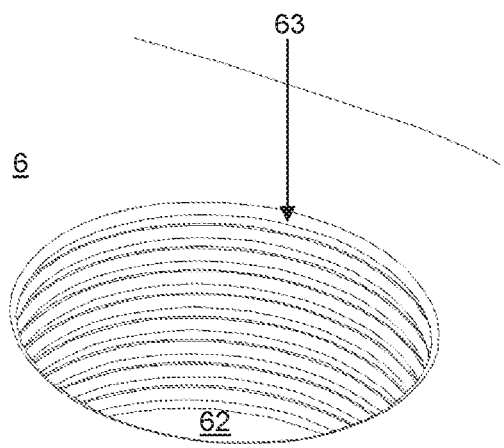
FIG. 2 depicts an enlarged perspective view of an opening in the pawl of FIG. 1, produced by a method of manufacture according to one embodiment of the invention.

The method of manufacture according to a first alternative form of the first embodiment of the invention will be illustrated in the context of the manufacture of an automaton pawl 6 depicted in FIGS. 1 and 2. This automaton pawl 6 is, for example, made of a technical ceramic, preferably a ceramic such as a yttria-stabilized zirconia, and comprises an opening 62 of which the wall comprises microstructures 63 which are designed to reduce, for example, the areas of contact between said wall of the opening 62 of the pawl and the guide means with which it collaborates. This pawl, and notably the microstructured wall of the opening 62, has a highly complex geometry which may advantageously be obtained by the method of manufacture according to the first embodiment.

We shall now describe a first embodiment of a method for manufacturing a master pattern intended to allow the manufacture of a mold for a horology component, and a method of manufacturing a horology component using the mold obtained from said master pattern, with reference to FIGS. 3 to 11, which is particularly suited to the manufacture of an automaton pawl as described hereinabove, and more generally suited to the manufacture of any horology component.

The method comprises a first step that consists in manufacturing E1 a first structure 10 on a substrate 20, using the traditional photolithography technique.

By convention, the horizontal direction will be defined as being a direction parallel to the plane of the substrate 20. The vertical direction is defined as being the direction perpendicular to the horizontal direction, and therefore perpendicular to the plane of the substrate.

This substrate 20 may take the form of a wafer made of metal, such as a stainless steel, or take the form of a silicon wafer, or a glass wafer, or a ceramic wafer. It is advantageously planar. It may optionally comprise structures which are produced, for example, by laser machining. These structures may, for example, include patterns, notably machined patterns, and/or cavities. The substrate is prepared in accordance with the rules known to those skilled in the art, notably with regards to degreasing it, cleaning it, possibly passivating and/or activating it. As a preference, the substrate 20 is provided with reference marks so that it can be positioned with great precision. The substrate 20 may be manufactured from a conducting material, for example a stainless steel. As an alternative, it might also be possible to use a substrate made from a non-conducting material, such as silicon for example. In that case, a conducting layer 21 may be applied to the upper surface of the substrate 20, for example using thermal evaporation, in a preliminary step performed prior to the first step E1. In a known way, this conducting initiating layer 21 may comprise a sublayer of chrome, of nickel or of titanium, covered with a layer of gold or of copper, and thus exhibit the form of a multilayer structure.

The first step comprises a substep that consists in applying E11 a first photosensitive resin 31 so that it covers all or part of the conducting layer 21 of the substrate 20 (or directly covers the upper surface of the substrate 20, in the absence of a conducting layer 21) with a layer of a first photosensitive resin 31 over a desired height, in accordance with the rules known by those skilled in the art. This first photosensitive resin 31 is suited to traditional photolithography. It may be negative or positive. In the case of the former, it is designed to become insoluble or soluble only with difficulty to a developer under the action of radiation (i.e., the exposed zones resist development), whereas in the case of the latter, it is designed to become soluble to a developer under the action of a radiation, whereas the part not exposed to the radiation remains insoluble or soluble only with difficulty. This photosensitive resin 31 may be of the SU-8 type, which is a negative photosensitive resin which becomes polymerized under the action of UV radiation, for example resin SU-8-100 by Microchem.

Figure 3:
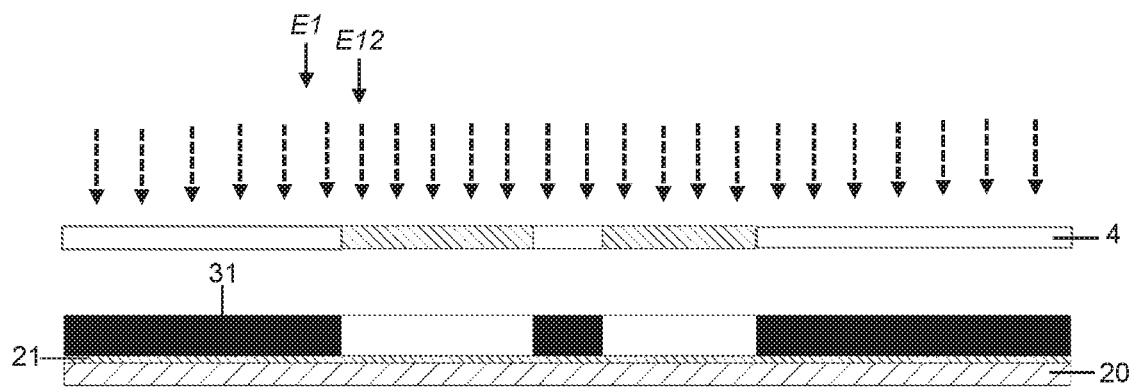
FIGS. 3 to 9 illustrate successive steps in a method of manufacturing a master pattern intended to allow the manufacture of a mold for an automaton pawl depicted in FIGS. 1 and 2 according to a first embodiment of the invention.
Figure 4:
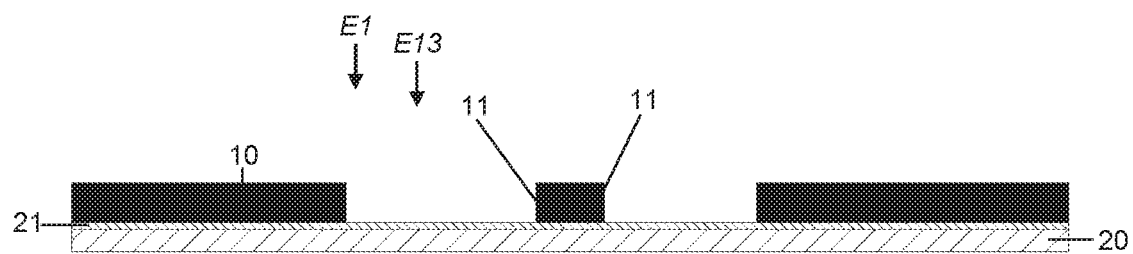

The first step then comprises a substep that consists in exposing E12 the first photosensitive resin 31 through a mask 4, notably using a UV radiation, X-ray radiation or a beam of electrons, in a direction substantially perpendicular to the mask, in order to polymerize it according to a first pattern defined by the mask 4, as illustrated in FIG. 3. This exposure consists in exposing the layer of photosensitive resin 31 to light radiation through the mask 4 comprising openings and opaque zones. This mask thus defines the first pattern that is to be reproduced in order to create the structure or a portion of the structure. The radiation used is perpendicular or substantially perpendicular to the plane in which the mask extends, and perpendicular or substantially perpendicular to the substrate 20, so that only the zones of resin situated immediately in line with the openings formed in the mask are irradiated. These zones are thus defined by vertical or substantially vertical walls, namely walls that are perpendicular or substantially perpendicular to the plane of the substrate 20. Alternatively, a mask having variations in transmittance can be used to form walls that are non-vertical or inclined.

Next, the first step comprises a substep that consists in developing E13 the first photosensitive resin 31. In the embodiment in which the resin 31 is a negative resin, development consists in eliminating the unexposed (i.e. non-irradiated) zones of resin, according to a method suited to the photosensitive resin 31, for example by dissolving them using a chemical product or using a plasma process. As an alternative, in the case of a positive photosensitive resin, the irradiated zones are eliminated during development for example via a chemical route and the non-irradiated zones are kept on the substrate. After development, the upper surface of the substrate 20, or the optional conducting layer 21 is revealed at the places from which the resin has been eliminated. The remaining parts of resin thus form a first structure 10, illustrated by FIG. 4. This structure rests on the upper surface of the substrate 20 or on the conducting layer 21, if any, of the substrate 20. The first structure 10 therefore extends between two horizontal surfaces, an upper one (defined as being the interface between the polymerized resin and the air) and a lower one (defined as being the interface between the polymerized resin and the upper surface of the substrate 20 or of the optional conducting layer 21), and comprises lateral surfaces 11, extending between these two horizontal surfaces, which are generally substantially vertical but which could as an alternative be inclined. These lateral surfaces are the result of the openings formed in the first photosensitive resin 31 by the removal of non-polymerized photosensitive resin using traditional photolithography. For preference, the first structure 10 has a constant height (measured between the two, upper and lower, surfaces).

In order to create a multi-layer structure, the first step E1 may involve repeating the substeps described hereinabove, with different masks, featuring different first sub-patterns, the result of which creates the first structure with a first pattern corresponding to the combination of the various first sub-patterns.

The method then comprises a second step that consists in transforming E2 the first structure 10 into a second structure 1 by structuring at least one surface of the first structure 10, notably at least one lateral surface 11 of the first structure 10.

This step involves the addition of a second three-dimensional pattern 12 in polymerized resin to said at least one surface.

Figure 5:
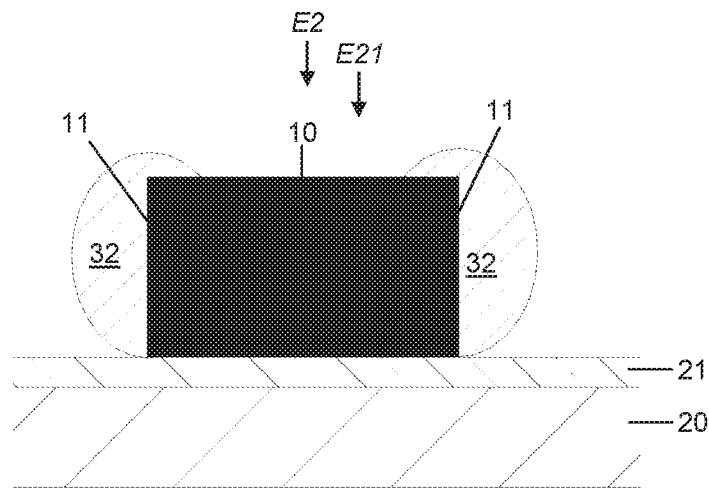

The second step thus comprises a substep consisting in applying E21 a layer of a liquid or semiliquid second photosensitive resin 32 on at least part of the at least one aforementioned surface of the first structure 10, notably on at least one lateral surface 11, as illustrated in FIG. 5. This step may, for example, be performed by drop casting or any other means that allows the application of liquid or semi-liquid resin (spray coating, spin coating, etc.). The second photosensitive resin 32 is particularly suited to the aforementioned two-photon polymerization technique. It may be negative or positive. In one particular embodiment, the photosensitive resin 32 used is a semiliquid resin, for example an IP-Dip™ resin by Nanoscribe, which is a negative resin. The embodiment is not restricted to the above description. The aforementioned surface of the first structure could as an alternative or in addition be horizontal, and not solely a lateral surface, notably in the case of the manufacture of a multilevel horology component.

Advantageously, the first and second photosensitive resins 31, 32 may be identical. The resin then used for the two steps E1, E2 is suited both to traditional photolithography and to two-photon polymerization.

Figure 6:
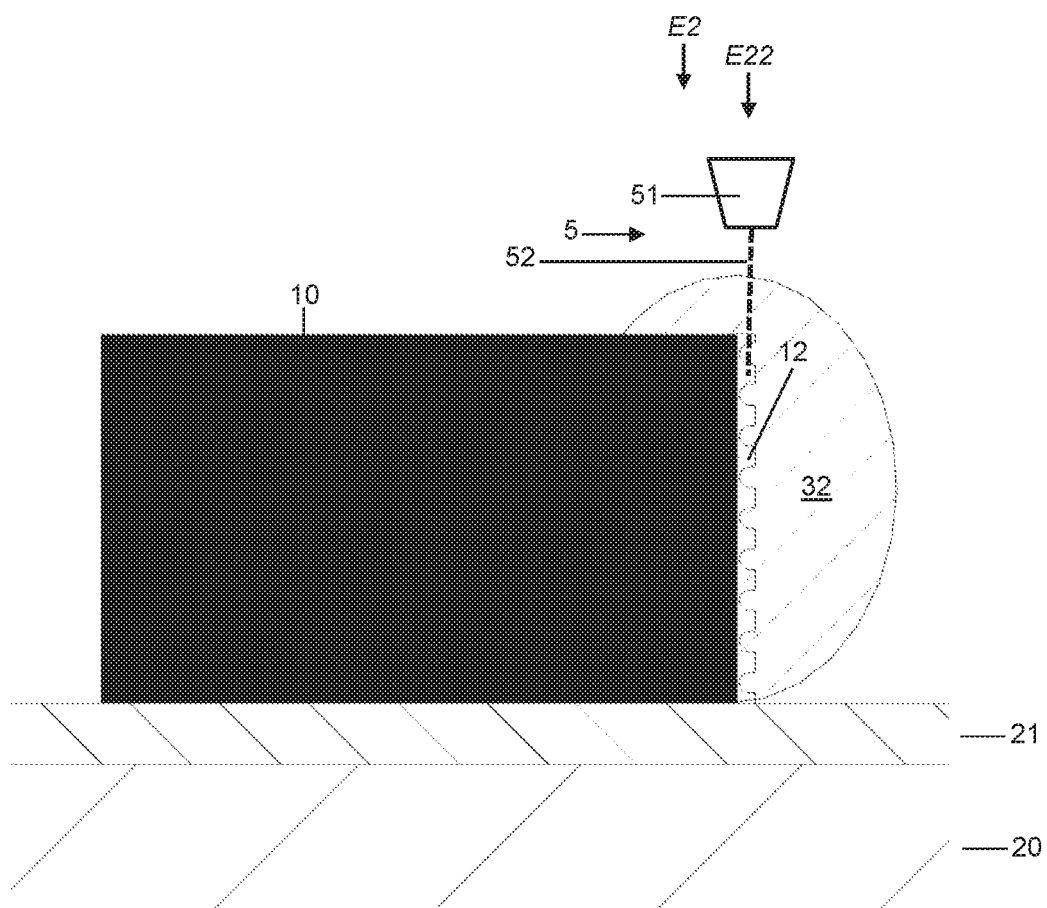

The second step then comprises a substep consisting in performing two-photon polymerization E22 on at least part of the layer of the second photosensitive resin 32, as illustrated in FIG. 6, in order to achieve three-dimensional polymerization according to a predefined second three-dimensional pattern. For that, the method may employ a photon device 5, which is intended to emit electromagnetic waves onto or into the photosensitive resin 32, so as to polymerize it according to spatial coordinates which correspond to the second pattern. The benefits of this method are the precision of the definition and the complexity of the patterns that can be achieved, such as notably patterns that are not continuous in the vertical direction.

According to one advantageous embodiment, the photon device 5 comprises an objective 51 which is at least partially immersed in the second photosensitive resin 32 so as to polymerize it according to spatial coordinates that define the shape or three-dimensional geometry 12 of the second pattern. Such an alternative form advantageously makes it possible to optimize the resolution of the second three-dimensional pattern. More particularly, the objective 51 is designed to direct and focus a laser beam 52 so that the focal point passes through the various spatial coordinates that define the shape or the geometry 12 of the second pattern. For each of the coordinates, two photons may be absorbed simultaneously by the resin 32, in a very small volume known as a "voxel" at the focal point of the laser 52. A chemical reaction is initiated, the liquid or semiliquid resin polymerizes and becomes solid within the voxel. The voxels resulting from the path of the focus of the laser beam 52 thus define the shape or the geometry 12 of the second pattern. When combining the focusing optic of the laser and the material of the photosensitive resin 32 to advantageous effect, the diameter of the voxel can be smaller than 0.1 µm, thus making it possible to define very high-resolution microstructurings or even nanostructurings on the at least one surface, notably on the at least one lateral surface 11, of the first structure 10. This step thus makes it possible to define a second pattern with a three-dimensional resolution of 0.001 µm$^3$ or better, and a lateral resolution equivalent to the diameter of the voxel, namely of 0.1 µm or better.

In addition, the at least partial or total immersion of the objective 51 in the second photosensitive resin 32 prevents the laser beam 52 to cross an interface between the objective and the air and an interface between the air and the second photosensitive resin, and avoids a deflection of the laser beam at said interfaces. The laser beam (photons beam) interacts exclusively with the second photosensitive resin: it is processed in a continuous medium, avoiding any parasitic reflection or refraction or power loss. In consequence, the path of the laser beam is minimized, and the detection of the already polymerized part is easier. It results that three-dimensional resolution of the second pattern is optimized, and that the processing speed is maximized.

Furthermore, as depicted in FIG. 6, this second pattern may extend at least in part in a horizontal direction, or a direction that has a significant horizontal component, from an application of second photosensitive resin 32 on a lateral surface 11 of the first structure 10, notably on a surface perpendicular or substantially perpendicular to the substrate 20.

Figure 7:
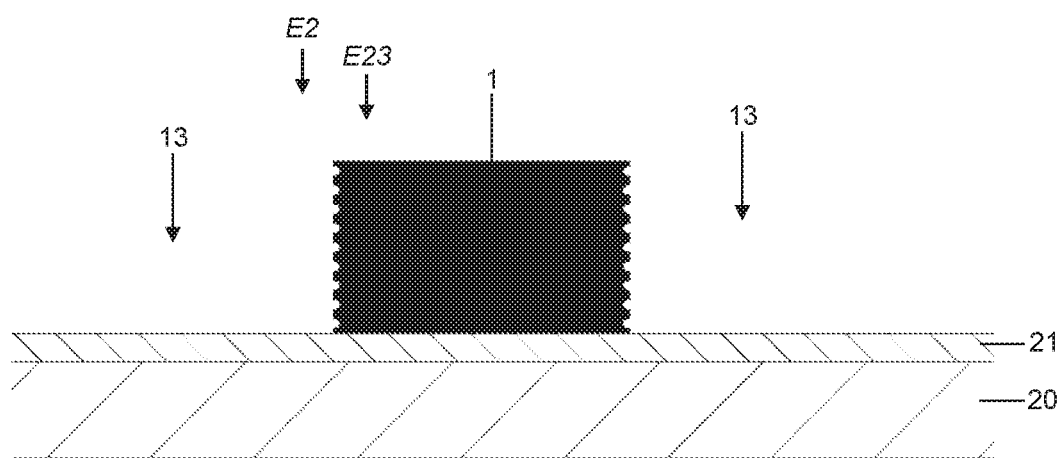

This step may therefore form microstructurings, or even nanostructurings, which may, for example, adopt the shape of squarewaves or staircases 12 on the surface 11, as illustrated in FIG. 7. These shapes do not cut into the surface 11, but are applied in relief on the surface 11.

The second step then comprises a substep consisting in developing E23 the second photosensitive resin 32 to eliminate the non-polymerized second photosensitive resin 32 and obtain the second structure 1 of a shape defined by the first and second patterns. Specifically, once the second photosensitive resin 32 has been polymerized according to the predefined three-dimensional geometry, those zones of photosensitive resin 32 that have not been exposed are eliminated, in the case of a negative photosensitive resin, for example by dissolving them in a chemical product, or using a plasma process. As a preference, the chemical product used is the same as the one used in the first step. This may, for example, be a PGMEA-based solvent.

At the end of this second step, the combination of the two photosensitive resins 31, 32 shaped respectively into the aforementioned two patterns finally forms a second structure 1 attached to the substrate 20.

According to the first embodiment, this second structure 1 is intended to form, together with the substrate 20, a first mold for the manufacture of a master pattern which is intended for manufacturing a second mold for the manufacture of a horology component. In this first embodiment, the second structure 1 may comprise at least one cavity 13.

As a result of the above-described steps E1, E2 of the method, it is possible to form a second structure 1 that has absolutely any complex three-dimensional shape, and therefore allows the creation of absolutely any master pattern for a mold for a horology component having a corresponding complex three-dimensional shape.

The method then implements a third step which consists in using E3, E3' the second structure 1 to manufacture a master pattern intended for the manufacture of a mold for manufacturing a horology component.

More particularly, this third step E3, E3' consists in using the second structure 1, together with the substrate 20, as a mold for the manufacture of a master pattern 2 intended for the manufacture of the second mold 3 intended for the direct manufacture of a horology component 6.

This master pattern 2 may notably comprise metal or a metal alloy or ceramic or a composite material. As a preference, the master pattern 2 comprises the substrate 20.

According to a first alternative form, described hereinafter, of the first embodiment, the master pattern 2 is the result of growing a layer 22 of metal or of a metal alloy on the substrate 20. Thus, the master pattern is preferably made up of the substrate 20, of the layer 21, if any, and of the layer 22 of metal or of the metal alloy that has grown on said substrate. Alternatively, the master pattern 2 comprises no substrate 20 and takes the form of the layer 22 of metal or of the metal alloy that has grown on the substrate, this layer being separated from said substrate beforehand.

Figure 8:
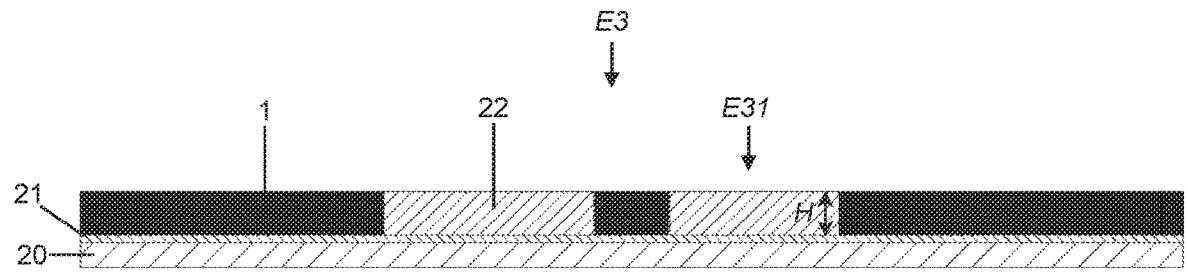

In this first alternative form of embodiment, the third step comprises a substep consisting in applying E31 a layer of metal 22 at least partially forming the master pattern 2, by electrodeposition or electroplating, into the cavity or cavities 13 of the second structure 1, as illustrated in FIG. 8. In this substep, the aforementioned conducting layer 21 or the substrate 20 itself if it is made from a conducting material, acts as the cathode to initiate the deposition reaction. This step uses, for example, the LIGA method and a metal or a metal alloy such as, for example, nickel (Ni) or nickel-phosphorus (NiP) or any nickel-based alloy. Advantageously, an alloy as described in document WO2017102661 may be used. The layer of metal 22 obtained preferably has the same height H as that of the mold formed by the second structure 1. It may also have a height less than the height of the mold, or even a height greater than the height of the mold. Optionally, this substep may comprise a height adjustment, by simultaneous mechanical polishing of the metal layer and of the mold, in order to obtain a perfectly planar horizontal upper surface.

Furthermore, the layer of metal 22 obtained preferably has a height H substantially greater than that of the layer 21. It is preferably greater than five times the height of the layer 21, or even greater than ten times the height of the layer 21.

In this first alternative form of embodiment, the third step may comprise an optional substep consisting in separating E32 the assembly formed by said layer of metal 22 and the second structure 1 from the substrate 20, for example by delaminating the conducting layer 21 from the substrate.

Figure 9:
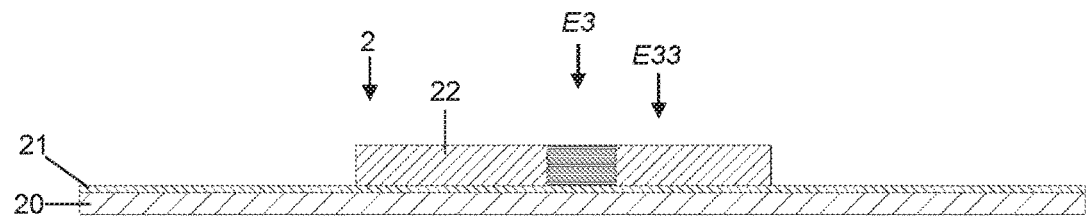

In this first alternative form of embodiment, the third step comprises a substep consisting in separating E33 the master pattern 2, notably formed by said layer of metal 22, from the second structure 1, for example by chemical attack or using a plasma, in order to achieve the result depicted in FIG. 9.

The possible substep E32 and the substep E33 may be performed in any order.

According to a second alternative form, described hereinafter, of the first embodiment, the master pattern 2 is the result of a formation of a layer of ceramic on the substrate 20. Thus, the master pattern is preferably made up of the substrate 20, of the layer 21, if present, and of the layer of ceramic formed on said substrate. Alternatively, the master pattern 2 does not comprise the substrate 20 and takes the form of the layer of ceramic on the substrate, this layer being separated from said substrate beforehand.

In this second alternative form of embodiment, the third step E3' comprises a substep consisting in using a liquid route to fill E31' the second structure 1 with a product containing ceramic powder. This step may, for example, involve pouring a slurry or pouring a gel or pouring a coagulation. Alternatively, this step may be implemented using electrophoresis in the case of a substrate made of a conducting material or in which the upper surface of the substrate is covered with a conducting layer 21. In the case of a slurry, this may contain a liquid substance, ceramic powder and at least one additive. The liquid substance may contain water, an alcohol or another organic solvent. The ceramic powder may for example comprise a zirconia or an alumina or an oxide or a carbide or a nitride. This step may be performed under vacuum in order to ensure perfect filling without inclusions of air.

This substep E31' may be preceded by an optional substep that consists in preparing at least a surface portion of the substrate 20 facing at least one cavity 13 of the second structure 1, or in applying a coating to at least a surface portion of the substrate 20 facing at least one cavity 13 of the second structure 1, with a view to making the future release of a blank of the master pattern 2 from the substrate 20 easier. Note that this blank may, for example, take the form of the green body that is the precursor of the master pattern 2.

In this second alternative form of embodiment, the first step comprises a substep consisting in consolidating E32' the product positioned in the second structure 1. This substep may notably comprise the drying of the slurry in order to obtain a blank of the master pattern 2.

An optional intermediate substep may consist in adjusting the height of the blank of the master pattern 2, prior to release of the mold. This blank may, for example, take the form of the green body that is the precursor of the master pattern 2.

In this second alternative form of embodiment, the third step comprises a substep that consists in separating E33' the blank of the master pattern from the manufacturing mold formed by the second structure 1. This separation may for example be achieved by chemical attack or by treatment using a plasma.

In this second alternative form of embodiment, the third step finally comprises a substep consisting in debinding the blank obtained in the previous step, and then in densifying it E34' by sintering. As a preference, the substrate 20 is made of a material intended to withstand the temperatures at which the substeps of the third step E3' are performed. For example, the substrate may be made of silicon or of alumina. Alternatively, the master pattern 2 does not comprise the substrate 20 and takes the form of the layer of ceramic separated beforehand from said substrate.

According to an alternative form of the first embodiment, the master pattern 2 may be made up at least in part of a soft material such as an elastomer. For example, and nonexhaustively, mention may be made of silicone, PDMS PolyDimethylSiloxane, rubber, polybutadiene, fluoroelastomer, etc.

Whatever the alternative form of embodiment of the first embodiment, the method of manufacturing a horology component comprises a fourth step consisting in using E4 the master pattern obtained in the method steps described hereinabove to manufacture a second mold 3. This second mold 3 is advantageously produced in a soft material so that it can be removed easily from the master pattern 2. This second mold 3 may, for example, be made of a polymer, notably of an elastomer such as PDMS (polydimethylsiloxane) or silicone.

This step E4 comprises a first step consisting in circumscribing E41 a volume intended to receive a volume 33 of elastomer which is the precursor of the second mold 3 using the master pattern 2 and an ancillary means such as an annular element 7, which at least partially define the impression cavity of the mold.

Figure 10:
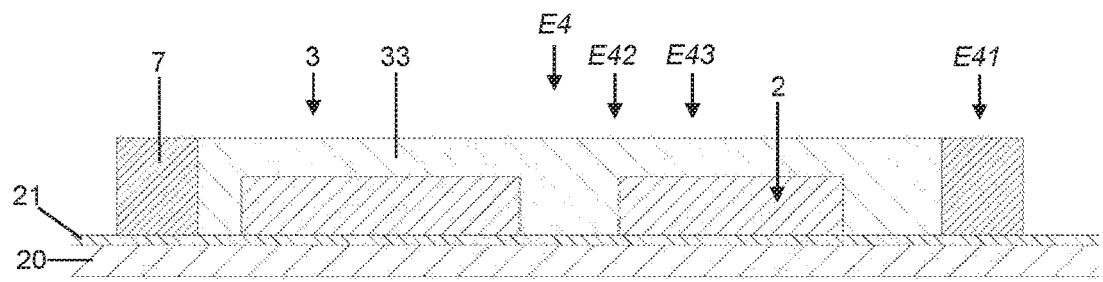
FIG. 10 illustrates a step in the manufacture of a mold for the automaton pawl on the basis of said master pattern resulting from the steps illustrated in FIGS. 3 to 9.
Figure 11:
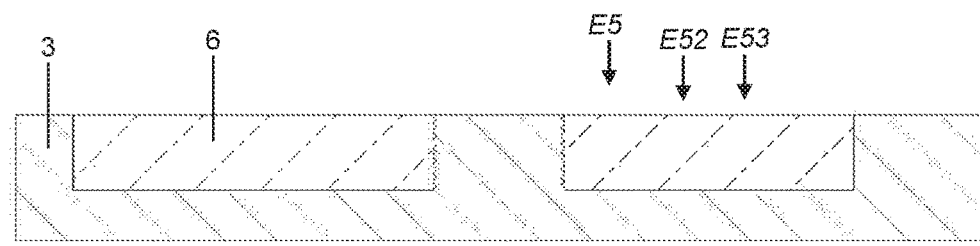
FIG. 11 illustrates a step in the manufacture of the automaton pawl on the basis of the mold obtained notably at the end of the step illustrated in FIG. 10.
Figure 12:
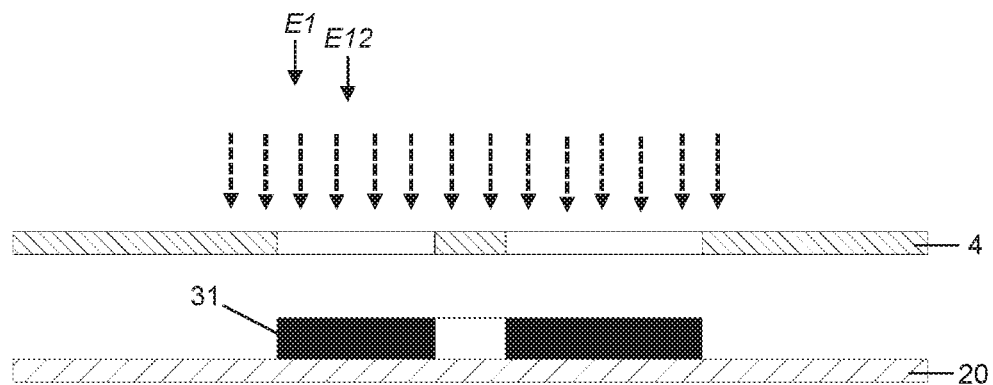
FIGS. 12 to 16 illustrate the successive steps in a method for manufacturing a master pattern intended to allow the manufacture of a mold for the automaton pawl depicted in FIGS. 1 and 2, according to a second embodiment of the invention.
Figure 13:
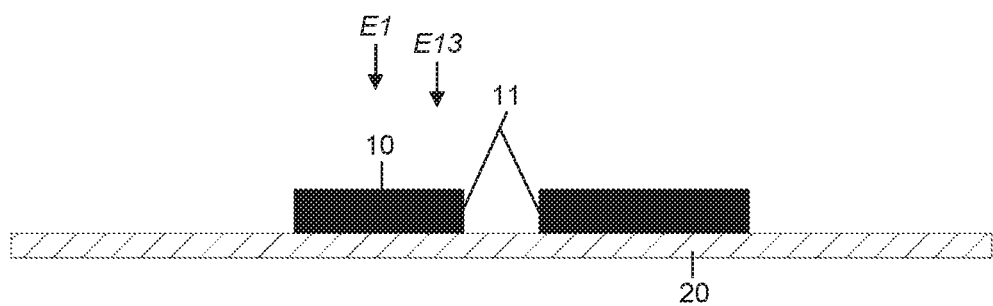
Figure 14:
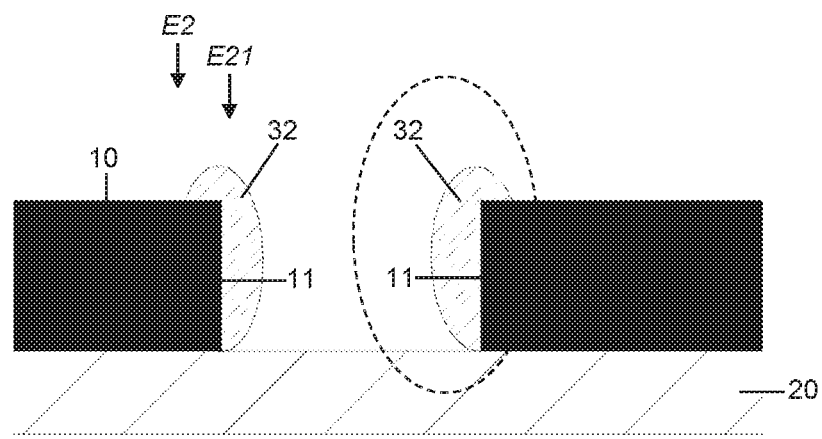
Figure 15:
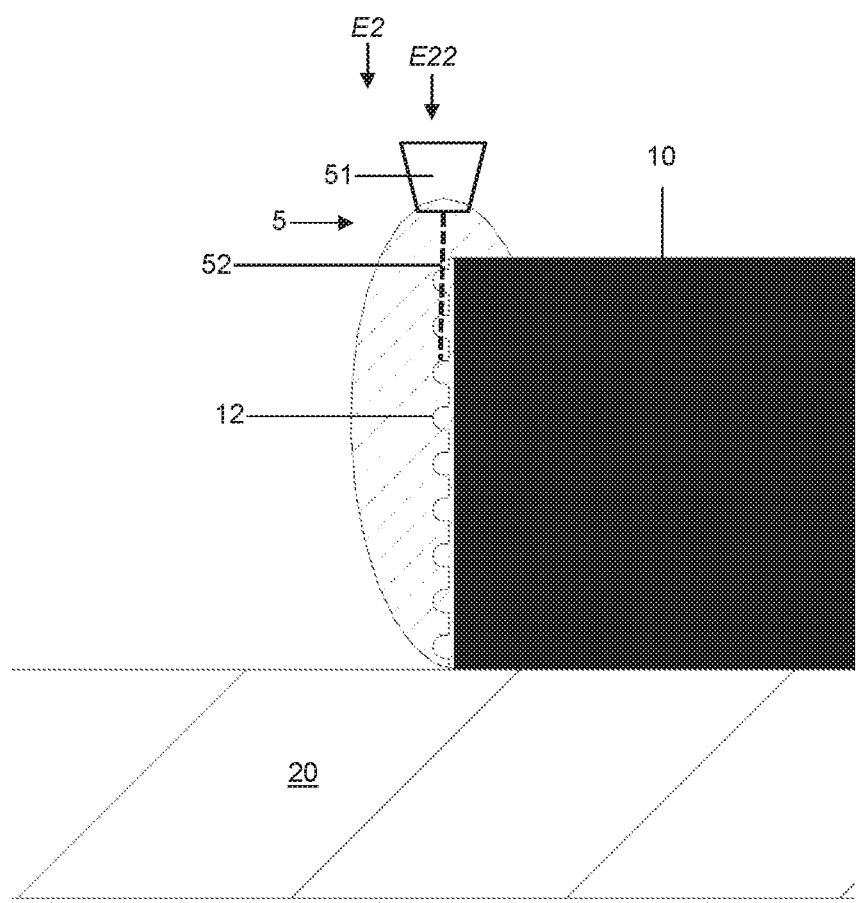
Figure 16:
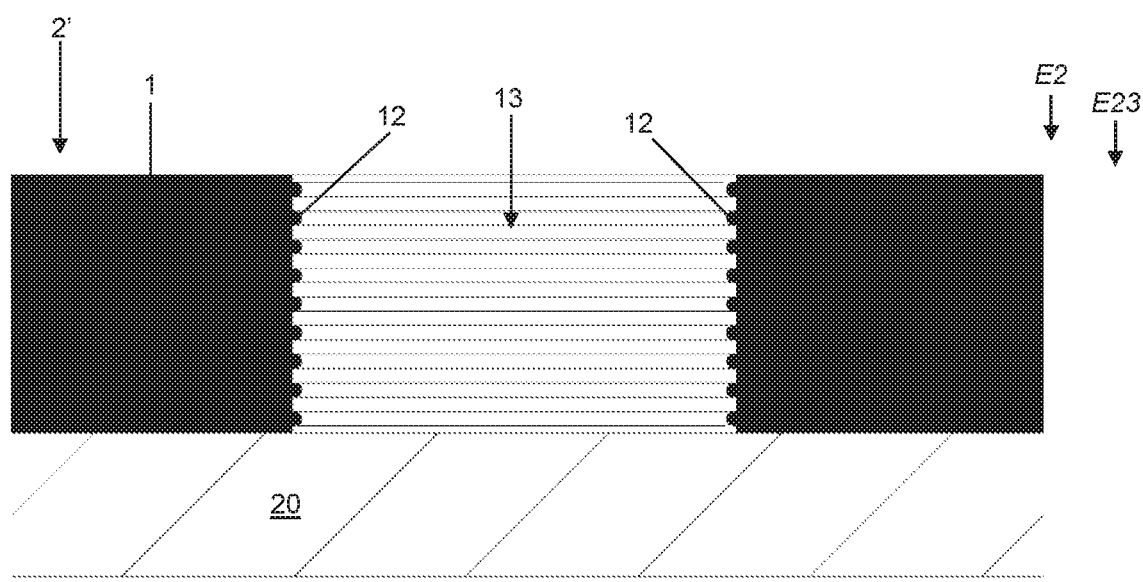

This step E4 then comprises a second substep which consists in pouring E42 the volume 33 of elastomer into the impression cavity defined by the master pattern 2 and the annular element 7, as illustrated in FIG. 10.

This step E4 then comprises a third substep which consists in polymerizing E43 the volume of elastomer 33 so as to solidify it in the impression cavity previously defined.

This step E4 then comprises a fourth substep which consists in separating E44 the elastomer mold 3 from the master pattern 2 and from the annular element 7.

Whatever the alternative form of embodiment of the first embodiment, the method of manufacturing a horology component then comprises a fifth step consisting in manufacturing E5 a horology component 6 using the second mold 3.

This step E5 for example comprises substeps E51, E52, E53, E54 which are similar to the substeps E31', E32', E33', E34' of the step E3' of the second alternative form of the first embodiment of the invention.

This step E5 may notably comprise a substep which consists in using a liquid route to fill E51 the mold 3 with a product comprising ceramic powder. This step may, for example, involve pouring a slurry or pouring a gel or pouring a coagulation. In the case of a slurry, the latter may contain a liquid substance, ceramic powder and at least one additive. The liquid substance may contain water, an alcohol or another organic solvent. The ceramic powder may, for example, contain a zirconia or an alumina or an oxide or a carbide or a nitride. This step may be performed under vacuum in order to ensure perfect filling without inclusions of air.

This substep E51 may be preceded by an optional substep consisting in preparing at least a surface portion of the mold 3 or in applying a coating to at least a surface portion of the mold 3, with a view to making future release of a blank of the component 6 from the mold 3 easier. Note that this blank may, for example, take the form of the green body that is the precursor of the component 6.

The step E5 may then notably comprise a substep consisting in consolidating E52 the product positioned in the mold 3. This substep may notably involve drying the slurry in order to obtain a blank of the component 6.

An optional intermediate substep may consist in adjusting the height of the blank of the component 6, before release from the mold.

The step E5 may then notably comprise a substep consisting in separating E53 the blank of the component 6 and the mold 3. This separation may, for example, be achieved through chemical attack or through the treatment using a plasma.

The step E5 may then notably comprise a substep consisting in debinding the blank of the component 6 obtained in the previous step and in densifying it E54 by sintering.

The horology component is preferably made from a ceramic or composite material. Such a ceramic component is preferably made of a ceramic known as a technical ceramic. "Technical ceramics" is the name given to dense materials based on aluminum oxide; and/or on zirconium oxide; and/or on zirconium oxide stabilized notably with yttrium oxide and/or cerium oxide and/or magnesium oxide; and/or made of strontium aluminate, notably doped strontium aluminate; and/or of nitrides; and/or of carbides; and optionally be pigmented notably using metal oxides and/or mixed metal oxides and/or spinel phases. To simplify the description, we can use the term "ceramic" to refer to the "technical ceramics" of which the component 6 may be made. A material is considered to be "dense" if its density is comprised between 95 and 100% of the theoretical density of the material in question. Note that the idea of being "based on" here means that the chemical component referred to represents at least 50 wt % of the overall chemical composition of the ceramic concerned. Note that the technical ceramic used to form the component is in theory different from the ceramic that might be used to form the mold.

In a second embodiment of the invention, the second structure 1 is intended to form, at least in part, a master pattern 2' for a mold 3' for the manufacture of a horology component 6. At the end of the second step E2, the combination of the two photosensitive resins 31, 32 shaped respectively into the two patterns described hereinabove forms a second structure 1 attached to the substrate 20.

FIGS. 12 to 16 illustrate the successive steps in a method for manufacturing a master pattern 2' intended to allow the manufacture of a mold 3' of the automaton pawl depicted in FIGS. 1 and 2 according to this second embodiment of the invention. This second structure 1 is here intended to form, together with the substrate 20, a master pattern 2' for the manufacture of a mold 3' for a horology component 6. Alternatively, the master pattern 2' does not comprise any substrate 20 and takes the form of the second structure 1, the latter being separated from said substrate beforehand. Thus, unlike in the first embodiment, the second structure 1 here directly forms the master pattern 2', rather than a mold for manufacturing a master pattern.

In this second embodiment, the second structure 1 may comprise at least one cavity 13.

Figure 17:
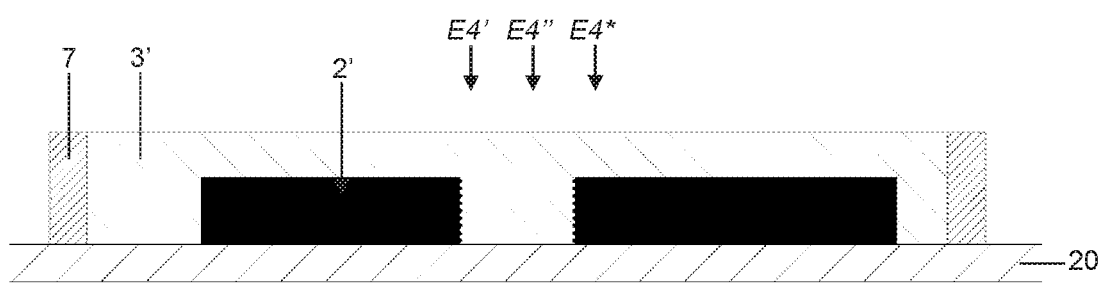
FIG. 17 illustrates a step in the manufacture of a mold for the automaton pawl on the basis of said master pattern resulting from the steps illustrated in FIGS. 12 to 16.
Figure 18:
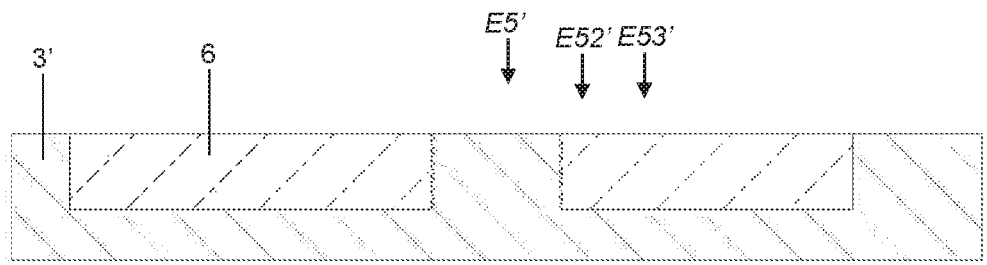
FIG. 18 illustrates a step in the manufacture of the automaton pawl on the basis of the mold obtained notably at the end of the step illustrated in FIG. 17.
Figure 19:
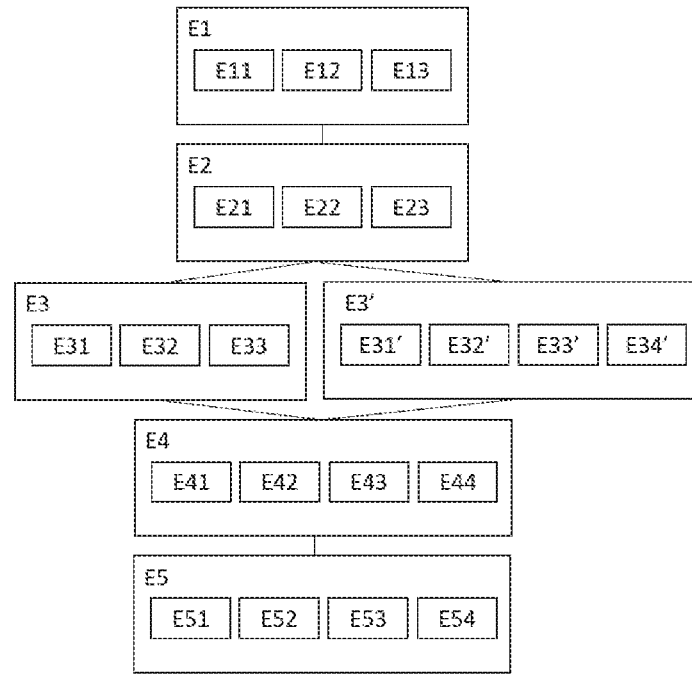
FIG. 19 illustrates a flow diagram schematically depicting the steps and substeps of the first and second alternative forms of the first embodiment.
Figure 20:
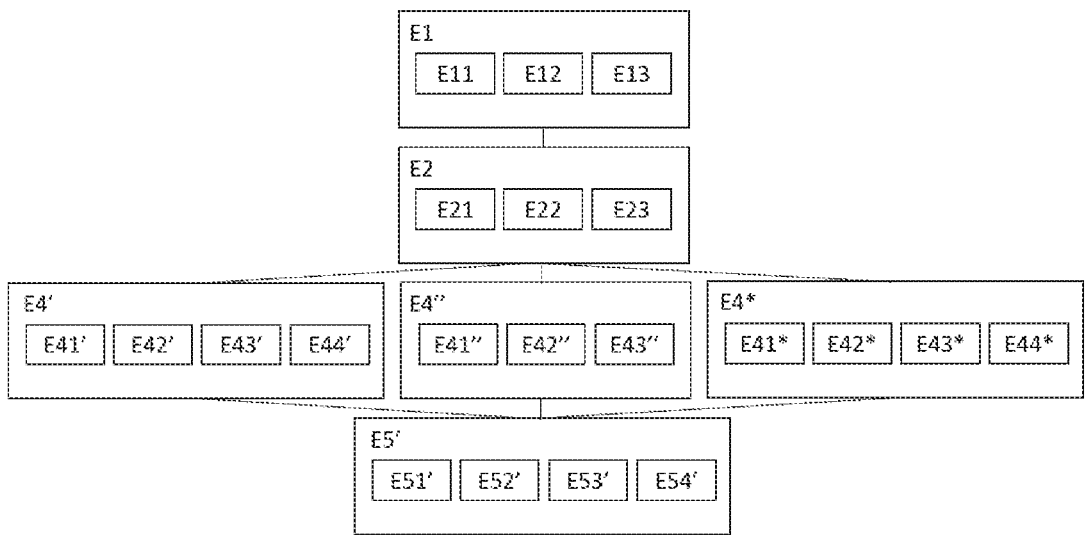
FIG. 20 illustrates a flow diagram schematically depicting the steps and substeps of first, second and third alternative forms of the second embodiment.

In this second embodiment, the method for manufacturing a horology component comprises a third step consisting in using E4', E4", E4* the master pattern 2' to manufacture a mold 3', as illustrated in FIG. 17.

According to a first alternative form of the second embodiment, this mold 3' is advantageously made of a soft material so that it can be removed easily from the master pattern 2'. This mold 3' may, for example, be made of a polymer, notably from an elastomer such as PDMS (polydimethylsiloxane) or silicone.

According to this first alternative form of the second embodiment, the method for manufacturing a horology component comprises a third step consisting in using E4' the master pattern 2' to manufacture a mold 3' as depicted in FIG. 17. The step E4' may, for example, comprise substeps E41', E42', E43', E44' similar to the substeps E41, E42, E43, E44 of step E4, which were described previously.

In the second and third alternative forms of the second embodiment, the mold 3' may be rigid. In that case, the master pattern 2' may be a sacrificial master pattern.

According to a second alternative form of the second embodiment, the mold 3' is the result of growing a layer of metal or of a metal alloy on the substrate 20. Thus, the mold 3' is preferably made up of the substrate 20, of the layer 21, if present, and of the layer of metal or of the metal alloy that has grown on said substrate. Alternatively, the mold 3' does not comprise the substrate 20 and takes the form of the layer of metal or of the metal alloy that has grown on the substrate, this layer being separated from said substrate beforehand. The mold 3' here comprises at least one cavity.

According to this second alternative form of the second embodiment, the third step consisting in using E4" the master pattern 2' to manufacture a mold 3' comprises substeps E41", E42", E43" which are similar to the substeps E31, E32, E33 of step E3 of the first alternative form of the first embodiment of the invention.

According to a third alternative form of the second embodiment, the mold 3' is the result of the formation of a layer of ceramic on the substrate 20. Thus, the mold 3' is preferably made up of the substrate 20, of the layer 21, if present, and of the layer of ceramic formed on said substrate. As an alternative, the mold 3' comprises no substrate 20 and takes the form of the layer of ceramic on the substrate, this layer having been separated from said substrate beforehand. The mold 3' here comprises at least one cavity.

According to this third alternative form of the second embodiment, the third step consisting in using E4* the master pattern 2' to manufacture a mold 3' comprises substeps E41*, E42*, E43*, E44* which are similar to the substeps E31', E32', E33', E34' of step E3' of the second alternative form of the first embodiment of the invention.

Whatever the alternative form of embodiment of the second embodiment, the method for manufacturing a horology component then comprises a fourth step which consists in manufacturing E5' a horology component 6 using the mold 3'.

Step E5' may notably comprise substeps E51', E52', E53', E54' which are similar to the substeps E51, E52, E53, E54 of step E5, which were described previously.

In the case of a rigid mold 3', the component 6 or the blank of the component 6 can be removed from the mold 3' by taking advantage of the shrinkage of the material of which the component or the blank of the component 6 is made.

The method for manufacturing a horology component described hereinabove may be used to manufacture all horology components such as, by way of illustrative and nonlimiting examples, a balance, a pallet, a jumper, a pinion, a wheel, a lever, a spring, a cam or even a blank. It may notably naturally be used to manufacture any element comprising a microstructure.

It is therefore apparent that the invention achieves the objectives sought by advantageously combining two different techniques. Traditional photolithography makes it possible to form the main volume of the master pattern intended to allow a mold for a horology component to be manufactured simply, quickly and reliably in a first step, and the two-photon polymerization technique allows complex shapes to be added to this main volume, in a second step that is more complex and not as quick but more precise and flexible, making it possible to define absolutely any three dimensional pattern. This results in a master pattern for a mold for a horology component that is complex in shape, and manufactured in a way that is simple and robust.

The invention claimed is:

1. A method for manufacturing a master pattern for a mold for a horology component, wherein the method comprises:
    manufacturing a first structure from a first photosensitive resin comprising at least one layer of photosensitive resin comprising a first pattern obtained by polymerizing the first photosensitive resin by irradiation through at least one mask, then developing the first photosensitive resin, the first structure having opposite main surfaces parallel to a main plane of the at least one layer and a lateral surface extending between the main surfaces; and
    transforming the first structure into a second structure by structuring at least one portion of the lateral surface of the first structure by the addition of a second photosensitive resin to the at least one portion of the lateral surface,
    wherein the transforming comprises:
    (i) applying a layer of the second photosensitive resin on at least part of the at least one portion of the lateral surface of the first structure;
    (ii) performing two-photon polymerization on the second photosensitive resin in order to obtain three-dimensional polymerization according to a second pattern, using a photon device which comprises an objective lens which is at least partially immersed in the second resin to direct and focus a beam on voxels that define a shape and/or a geometry of the second pattern; and
    (iii) developing to eliminate non-polymerized second photosensitive resin and obtain the second structure formed on the at least one portion of the lateral surface of the first structure and having a shape defined by the first and second patterns.

2. The method for manufacturing a master pattern for a mold for a horology component as claimed in claim 1, wherein the performing of the two-photon polymerization makes it possible to define the second pattern with a three-dimensional resolution equal to 0.001 $\mu m^3$ or better and/or with a lateral resolution equal to 0.1 $\mu m$ or better.

3. The method for manufacturing a master pattern for a mold for a horology component as claimed in claim 2, wherein the first photosensitive resin covers all or part of a substrate, wherein the developing of the first photosensitive resin comprises exposing the first resin, and wherein the exposing of the first resin generates the first structure comprising lateral flanks perpendicular or substantially perpendicular to the substrate and/or a constant cross section parallel or substantially parallel to the substrate.

4. The method for manufacturing a master pattern for a mold for a horology component as claimed in claim 3, wherein the second structure directly forms the master pattern of a mold for a horology component.

5. The method for manufacturing a master pattern for a mold for a horology component as claimed in claim 2, wherein:
    the two resins are identical; and/or
    both resins are positive or both resins are negative; and/or
    the first resin is a negative photosensitive resin which becomes polymerized under action of UV radiation; and/or
    the second resin is a liquid or semiliquid resin.

6. The method for manufacturing a master pattern for a mold for a horology component as claimed in claim 2, wherein the second structure directly forms the master pattern of a mold for a horology component.

7. The method for manufacturing a master pattern for a mold for a horology component as claimed in claim 1, wherein:
    the two resins are identical; and/or
    both resins are positive or both resins are negative; and/or
    the first resin is a negative photosensitive resin which becomes polymerized under action of UV radiation; and/or
    the second resin is a liquid or semiliquid resin.

8. The method for manufacturing a master pattern for a mold for a horology component as claimed in claim 1, wherein the method further comprises:
    using electrodeposition or electroplating to apply to the second structure a layer of metal that at least partially forms the master pattern for the mold for the horology component; and
    separating from the second structure the master pattern for the mold for the horology component which is formed by the layer of metal.

9. The method for manufacturing a master pattern for a mold for a horology component as claimed in claim 8, wherein the metal is nickel-based or is a nickel-phosphorus alloy.

10. A method for manufacturing a blank for a mold for a horology component, wherein the method comprises:
    manufacturing the master pattern by the method as claimed in claim 1, filling the second structure by pouring a pourable product containing ceramic powder and at least one binder;

consolidating the product into a solid product;

separating from the second structure the blank formed by the solid product; and debinding the blank obtained in the separating, then densifying the blank by sintering.

11. The method for manufacturing a master pattern for a mold for a horology component as claimed in claim 1, wherein the second structure directly forms the master pattern of a mold for a horology component.

12. A method for manufacturing a horology component, wherein the method comprises:

manufacturing the master pattern using the method as claimed in claim 1, using the master pattern to manufacture a mold for manufacturing a horology component, and then using the mold as a manufacturing mold to manufacture the horology component.

13. The method for manufacturing a horology component as claimed in claim 12, wherein the mold is manufactured from a polymer.

14. The method for manufacturing a horology component as claimed in claim 13, wherein the using of the master pattern to manufacture the mold comprises:

circumscribing, with an annular element, a volume intended to receive a volume of polymer, to complement the master pattern;

pouring a volume of elastomer into an impression cavity formed by the master pattern completed by the annular element;

polymerizing the volume of elastomer so as to solidify it;

separating the elastomer mold from the master pattern and from the annular element.

15. The method for manufacturing a horology component as claimed in claim 13, wherein the mold is manufactured from an elastomer.

16. The method for manufacturing a horology component as claimed in claim 15, wherein the mold is manufactured from polydimethylsiloxane (PDMS) or silicone.

17. The method for manufacturing a horology component as claimed in claim 12, wherein the mold is manufactured in metal or in metal alloy or in ceramic.

18. The method for manufacturing a horology component as claimed in claim 12, wherein the manufacturing of the horology component comprises manufacturing the horology component in technical ceramic using the following:

filling the mold by pouring a pourable product containing ceramic powder and at least one binder;

consolidating the product into a solid product;

separating a blank formed by the solid product from the manufacturing mold; and debinding the blank obtained in the separating, then densifying the blank by sintering.

19. The method for manufacturing a horology component as claimed in claim 12, wherein the horology component is made of ceramic.

20. The method for manufacturing a horology component as claimed in claim 19, wherein the horology component is made of technical ceramic.

* * * * *